United States Patent
Holman et al.

(10) Patent No.: US 6,717,789 B2
(45) Date of Patent: Apr. 6, 2004

(54) POWER SUPPLY REJECTION CIRCUIT FOR CAPACITIVELY-STORED REFERENCE VOLTAGES

(75) Inventors: Perry A. Holman, Garland, TX (US); Jason M. Chilcote, Frisco, TX (US)

(73) Assignee: Honeywell International Inc., Morristown, NJ (US)

( * ) Notice: Subject to any disclaimer, the term of this patent is extended or adjusted under 35 U.S.C. 154(b) by 119 days.

(21) Appl. No.: 10/008,899

(22) Filed: Dec. 5, 2001

(65) Prior Publication Data

US 2003/0103302 A1 Jun. 5, 2003

(51) Int. Cl.$^7$ ............................. H02H 3/22; H04B 1/10
(52) U.S. Cl. ...................... 361/111; 361/113; 327/554; 307/105
(58) Field of Search ............................... 327/551, 552, 327/553, 554; 307/105, 109; 361/88, 90, 111, 113

(56) References Cited

U.S. PATENT DOCUMENTS

| | | |
|---|---|---|
| 3,781,164 A | 12/1973 | Dutton |
| 4,831,431 A | 5/1989 | Hanlon |
| 4,841,458 A | 6/1989 | Levine et al. |
| 4,908,623 A | 3/1990 | Ullestad |
| 5,030,848 A | 7/1991 | Wyatt |
| 2002/0109580 A1 * | 8/2002 | Shreve et al. ............. 340/5.61 |

* cited by examiner

Primary Examiner—Jessica Han
(74) Attorney, Agent, or Firm—Kris T. Fredrick; Kermit D. Lopez; Luis M. Ortiz

(57) ABSTRACT

A power supply rejection circuit and method thereof for capacitively-stored reference voltages is disclosed. The power supply rejection circuit generally comprises a comparison circuit for comparing a signal associated with a power supply such as, for example, a Wheatstone bridge configuration, to a stored reference voltage, such that the comparison circuit includes at least one existing capacitor therein. At least one additional capacitor can be then coupled to the comparison circuit, such that the additional capacitor creates a capacitively-coupled voltage divider. This capacitively-coupled voltage divider negates the first order effects of power supply noise in the system. This effect significantly reduces the effect of power supply noise and improves signal jitter associated with the comparison circuit during a comparison of the signal to the stored reference voltage utilizing the comparison circuit.

19 Claims, 2 Drawing Sheets

POWER SUPPLY REJECTION CIRCUIT FOR CAPACITIVELY-STORED REFERENCE VOLTAGES

TECHNICAL FIELD

The present invention is generally related to comparison circuits and methods thereof. The present invention is also related to circuits that compare signals to capacitively stored voltage references. The present invention is additionally related to differential circuitry. The present invention is also related to circuits and techniques thereof for reducing the effect of power supply noise and reducing signal jitter. The present invention is additionally related to sensor jitter.

BACKGROUND OF THE INVENTION

Circuits that compare a signal to a capacitively stored voltage reference, based on the value of the signal in the past, are generally impaired by changes in the power supply voltage, including noise. In such circuits the signal is a function of the power supply. The difference in the power supply voltage between the time an associated capacitor was initially charged, based on the past value of a signal, and the time the comparison to the present signal was accomplished provides an error that can register as signal jitter.

There are generally two types of jitter, commonly referred to as random jitter and deterministic jitter, the sum of which yields the total jitter at a specific reference plane in a communication system. Random jitter is the result of the random nature of noise sources within any non-ideal device. Sources of random noise include, but are not limited to, thermal, shot and flicker noise. Random noise sources add, root-mean-square-wise, to generally comprise the entire random jitter contribution of a system or subsystem. The predominant random noise source is a complex function of the system or subsystem implementation and the operational bandwidth.

Deterministic jitter results from systematic sources that by their nature can be "determined". Examples of deterministic jitter include, but are not limited to, duty cycle distortion, unequal rise and fall times for the devices used in the system's implementation, dispersion due to interconnect media and distortion caused by the different frequencies that propagate through a transmission media at different phase velocities. Since high-frequency components of a signal are generally attenuated more than lower frequency components of the same signal, deterministic jitter tends to be prevalent in broad bandwidth systems.

A variety of techniques can be utilized to reduce jitter. Differential circuitry, for example, typically provides sufficient immunity to common mode and power supply noise. Once the signal is converted to a single-ended signal to compare against a capacitively-stored reference, however, this immunity is often lost.

Based on the foregoing, the present inventors have concluded that a need exits for a reliable and efficient circuit and technique thereof for reducing signal jitter and canceling the first order effects of power supply noise, particularly in configurations in which signals are compared to capacitively-stored reference voltages. The present inventors believe the circuit described herein, including a method for forming such a circuit, addresses these needs.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is, therefore, one aspect of the present invention to provide an improved comparison circuit for comparing signals to capacitively stored voltage references.

It is another aspect of the present invention to provide a power supply rejection circuit for capacitively-stored reference voltages.

It is yet another aspect of the present invention to provide a power supply rejection circuit in which a cancellation of power supply noise results.

It is still another aspect of the present invention to provide a power supply rejection circuit that forces differences in supply voltage to appear on a capacitor reference voltage.

It is also an aspect of the present invention to provide a power supply rejection circuit, which reduces the effect of power supply noise when comparing a signal to a capacitively-stored reference.

It is additionally an aspect of the present invention to provide a power supply rejection circuit that may be adapted for use with a sensor.

The above and other aspects can be achieved as is now described. A power supply rejection circuit and method thereof for capacitively-stored reference voltages is disclosed herein. The power supply rejection circuit generally comprises a comparison circuit for comparing a signal associated with a power supply to a stored reference voltage, such that the comparison circuit includes at least one existing capacitor therein. At least one additional capacitor can be then coupled to the comparison circuit such that the additional capacitor creates a capacitively coupled voltage divider in parallel with the stored reference voltage. This capacitor voltage divider can thus negate the first order effects of power supply noise in the system. Utilizing an additional capacitor in this manner can thus significantly reduce and/or eliminate the effect of power supply noise.

The additional capacitor generally comprises a first end and a second end. The first end of the additional capacitor is generally connected to the existing capacitor of the comparison circuit. The second end of the additional capacitor can also be connected to the supply voltage. In this manner, the additional capacitor comprises a capacitor from the supply voltage to a stored reference point associated with the power supply rejection circuit.

The existing capacitor generally comprises a second capacitor from the stored reference voltage to a ground. The additional capacitor and the existing capacitor together effectively operate in parallel with one another. The additional capacitor connected to the comparison circuit forces a percentage of the differences in supply voltage to appear on the stored reference voltage, thereby ensuring that the stored reference voltage is adjusted an equal amount by which a present single-ended output signal from the comparison circuit is offset. The percentage can thus be determined by a ratio of capacitors.

The present invention thus reduces the effect of power supply noise when comparing a single-ended signal to a capacitively-stored reference. This is accomplished by forcing differences in supply voltage to appear on a capacitor reference voltage. In this manner, the capacitively-stored reference voltage can be adjusted the same amount by which a present single-ended output signal is offset. This technique provides a cancellation of power supply noise (i.e., differences over time) and improves signal jitter.

The present invention thus provides an improvement by adding at least one capacitor to the comparison circuit. One end of the added capacitor can be added to the existing capacitor, which stores the reference voltage. The other end of the added capacitor can be connected to the supply voltage (i.e., versus ground for the other capacitor). The end result is a capacitor from the supply to the stored reference point and a capacitor from the stored reference signal to ground (i.e., existing cap).

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
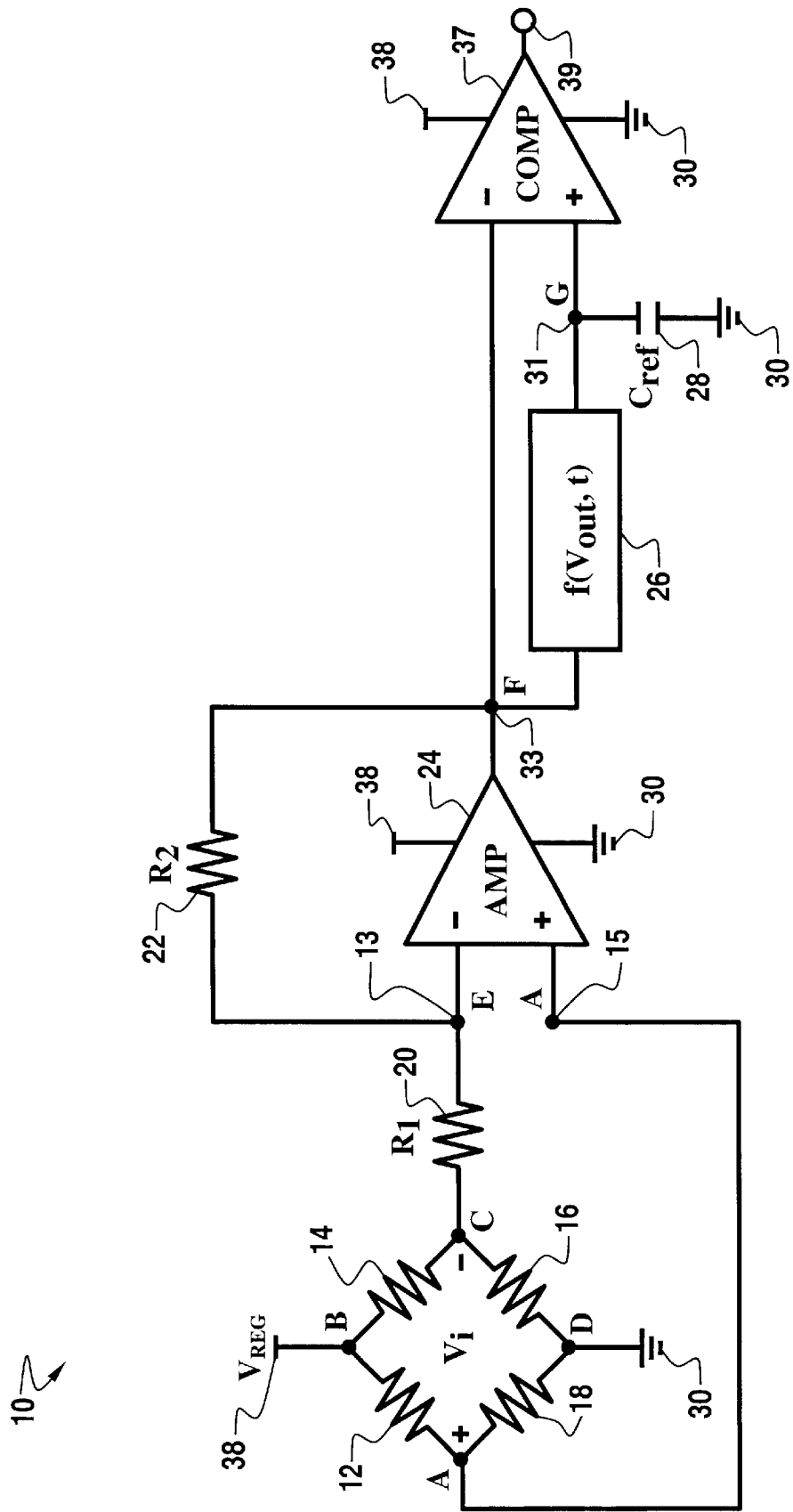
FIG. 1 illustrates a prior art schematic circuit diagram.

FIG. 1 is a schematic circuit diagram 10 illustrating standard AC coupled topology. Schematic circuit diagram 10 is illustrated to indicate problems associated with prior art circuits that compare particular signals to a capacitively stored voltage reference. In so doing, such comparison results are impaired by changes in the power supply voltage, including noise. Circuit diagram 10 of FIG. 1 depicts a resistor 12 coupled to a resistor 14 at node B. Node B is generally connected to a voltage VREG (i.e., voltage 38). Resistor 14 is coupled a resistor 16 and a resistor 20 at node C. The following mathematical representation is indicated at node C:

$$\frac{VREG}{2} - \frac{Vi}{2}$$

A resistor 18 is connected to resistor 16 at node D, which is further coupled to ground 30. Resistor 18 is also coupled to resistor 12 at node A. Resistor 20 is connected to resistor 22 at node E, which is further connected to a negative input 13 of amplifier 24. Node A is also connected to a positive input 15. Amplifier 24 is coupled to a ground 30 and to resistor 22 at node F. Amplifier 24 is also coupled to voltage 38 (i.e., a power supply voltage). The following mathematical representation is indicated at node A and also at inputs 13 and 15 of amplifier 24:

$$\frac{VREG}{2} + \frac{Vi}{2}$$

Block 26 represents the following function: $f(V_{out}, t)$. The function illustrated at block 26 changes the reference capacitor based on the value of the output node F, which can be a function of time. Block 26 may represent a variety of possible functions, including, for example, a resistor, a current source, etc. Block 26 is thus connected to resistor 22 and amplifier 24 at node F. Block 26 is also connected to a capacitor 28 at node G. Capacitor 28 is labeled $C_{ref}$ and is connected to a ground 30, in addition to block 26 at node G. An output voltage from amplifier 24 can also be obtained at node F. Such an output voltage can be provided through the following mathematical representation:

$$Vout = \left(\frac{VREG}{2} + \frac{Vi}{2}\right) + R2 \cdot \frac{Vi}{R1} = \frac{VREG}{2} + Vi\left(\frac{R2}{R1} + \frac{1}{2}\right)$$

Note that voltage $V_i$ (i.e., the differential input voltage) can be found between node A and node C through a configuration, such as, for example, a Wheatstone bridge. Resistor 20 comprises resistor R1, while resistor 22 comprises resistor R2.

A positive input 31 of a comparator 37 is connected to capacitor 28 at node G. A negative input 33 of comparator 37 is connected to node F and hence, block 26. Thus, a differential voltage $V_{diff}$ exists between node F and node G. The differential voltage $V_{diff}$ can be provided by the following mathematical representation:

$$Vdiff = \frac{VREG}{2} + Vi\left(\frac{R2}{R1} + \frac{1}{2}\right) - Vcap$$

Comparator 37 is further connected to voltage 38 (i.e., power supply VREG) and ground 30. Comparator 37 provides an output 39. Based on the schematic diagram 10 of FIG. 1, it can be appreciated that any change (or noise) in VREG changes $V_{diff}$, causing jitter and repeatability errors. The difference in the power supply voltage between the time the reference voltage is initially charged and the present signal provides an error that shows up as signal jitter. Differential circuitry typically has good immunity to common mode and power supply noise; however, once the signal is converted to a single-ended signal to compare against a capacitively-stored reference, this immunity is lost.

It is important to note that in the configuration depicted in FIG. 1, perfect power supply rejection (PSR) and common mode rejection (CMR) are assumed. In most electronic configurations, the signal is electrical, and PSR is present from the signal and a conditioning circuit. In the case of sensors, for example, the signal is generally derived from a transducer, which runs from the power supply and contains a common mode (CM) representation of the supply. With an AC coupled comparator topology, where the differential signal is converted to a single-ended signal, CMR is lost. Thus, any noise output from the transducer, which is induced from the power supply, is transferred throughout the circuit. The present invention thus introduces a unique solution to reduce and eliminate power supply noise, particularly evidenced as CM noise when a transducer is present.

Figure 2:
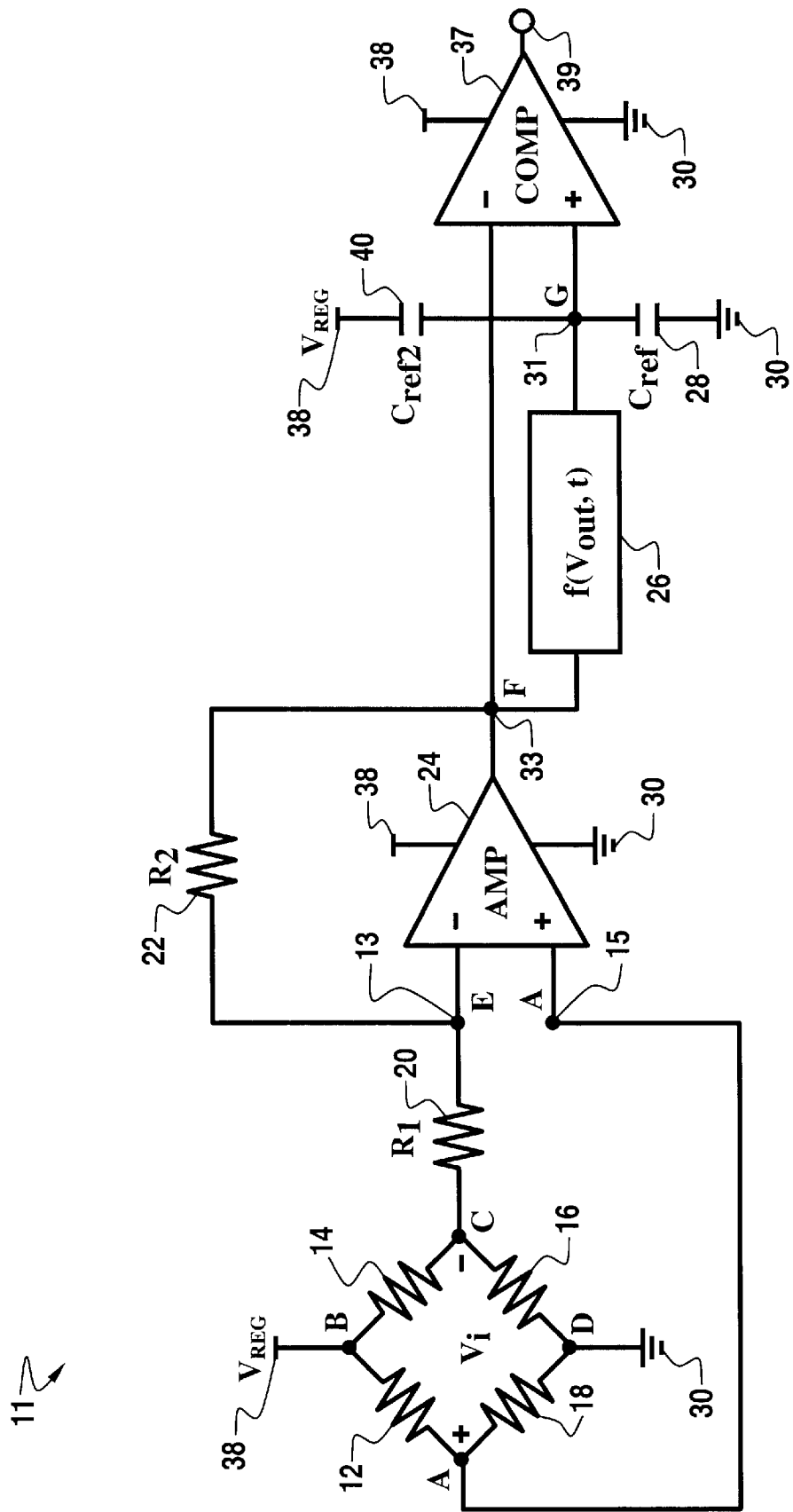
FIG. 2 depicts a schematic circuit diagram illustrating a double capacitor AC coupled topology in accordance with a preferred embodiment of the present invention.

Note that in FIGS. 1 and 2 herein like parts are indicated by identical reference numerals. FIG. 2 depicts a schematic circuit diagram 11 illustrating a double capacitor AC coupled topology in accordance with a preferred embodiment of the present invention. Schematic circuit diagram 11 of FIG. 2 differs form schematic circuit diagram 10 of FIG. 1 in the addition of a capacitor 40, which is also labeled in FIG. 2 as $C_{ref2}$. Note that resistors 12, 14, 16 and 18 can comprise a transducer. Although resistors 12, 14, 16 and 18 are arranged in a Wheatstone bridge configuration, as illustrated in FIGS. 1 and 2, it can be appreciated that other transducer designs and configurations may also be implemented in accordance with the method and system of the present invention. Additionally, other elements can be utilized to implement such a transducer. Amplifier 24 and resistor 22, along with resistor 20 may be configured to comprise a signal conditioning circuit. Again, it can be appreciated that variations on the design of such a signal conditioning circuit can be implemented in accordance with the method and system of the present invention.

The following mathematical representation is indicated at input 21 and node G of FIG. 2:

$$Vcap + \left(\frac{VREG}{2}\right)$$

The AC component is indicated by the following:

$$\left(\frac{VREG}{2}\right)$$

In FIG. 2, the following mathematical representation holds true for input 33 and node F:

$$Vout = \left(\frac{VREG}{2} + \frac{Vi}{2}\right) + R2 \cdot \frac{Vi}{R1} = \frac{VREG}{2} + Vi\left(\frac{R2}{R1} + \frac{1}{2}\right)$$

Additionally, as illustrated in FIG. 2, the differential voltage is generally indicated by the following mathematical representation:

$$Vdiff = Vi\left(\frac{R2}{R1} + \frac{1}{2}\right) - Vcap$$

Based on the foregoing, it can be appreciated that, by implementing the configuration illustrated in FIG. 2, any change (or noise) in VREG is generally cancelled, thereby reducing jitter and repeatability errors, unlike the prior art configuration depicted in FIG. 1.

Based on the foregoing, it can be appreciates that the present invention disclosed herein generally comprises a power supply rejection circuit and method thereof for capacitively-stored reference voltages. The power supply rejection circuit generally comprises a comparison circuit for comparing a signal associated with a power supply to a stored reference voltage, such that the comparison circuit includes at least one existing capacitor therein. At least one additional capacitor can be then coupled to the comparison circuit, such that the additional capacitor eliminates the effect of power supply noise and improves signal jitter associated with the comparison circuit during a comparison of the signal to the stored reference voltage utilizing the comparison circuit.

The additional capacitor generally comprises a first end and a second end. The first end of the additional capacitor is thus generally connected to the existing capacitor of the comparison circuit. The second end of the additional capacitor can also be connected to the supply voltage. The addition of an extra reference capacitor, as described herein, thus forms a power supply rejection circuit, which eliminates the first order effects of power supply noise in the system.

The existing capacitor generally comprises a second capacitor from the stored reference voltage to a ground. The additional capacitor and the existing capacitor can together effectively operate in parallel with one another. The stored reference voltage comprises a capacitively-stored reference voltage, while the existing capacitor of the comparison circuit comprises a capacitor for storing the stored reference voltage. The additional capacitor connected to the comparison circuit forces differences in supply voltage to appear on the stored reference voltage, thereby ensuring that the stored reference voltage is adjusted an equal and opposite amount by which the present single-ended output signal would have shifted due to the supply voltage shift.

The present invention thus reduces the effect of power supply noise when comparing a signal to a capacitvely-stored reference. This is accomplished by forcing differences in supply voltage to appear on a capacitor reference voltage. In this manner, the capacitively-stored reference voltage can be adjusted the same amount by which a present single-ended output signal is offset. This method provides a cancellation of power supply noise (i.e., differences over time) and improves signal jitter.

The present invention thus advances an improvement by adding at least one capacitor to the comparison circuit. One end of the added capacitor can be added to the existing capacitor, which stores the reference voltage. The other end of the added capacitor can be connected to the supply voltage (i.e., versus ground for the other capacitor). The end result is a capacitor from the supply to the stored reference point and a capacitor from the stored reference signal to ground (i.e., existing cap).

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those skilled in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows:

1. A power supply rejection circuit for capacitively-stored reference voltages, said power supply rejection circuit comprising:

a comparison circuit for comparing a signal associated with a power supply to a stored reference voltage, wherein said comparison circuit includes at least one existing capacitor therein; and at least one additional capacitor coupled to said comparison circuit, wherein differences in supply voltage are forced to appear on said stored reference voltage through the utilization of said at least one additional capacitor connected to said comparison circuit, thereby ensuring that said stored reference voltage is adjusted a proportionate amount by which a present single-ended output signal from said comparison circuit is offset, such that said at least one additional capacitor eliminates the effect of power supply noise during a comparison of said signal to said stored reference voltage utilizing said comparison circuit.

2. The power supply rejection circuit of claim 1 wherein said at least one additional capacitor comprises a first end and a second end.

3. The power supply rejection circuit of claim 2 further comprising
said first end of said at least one additional capacitor connected to said at least one existing capacitor of said comparison circuit; and
said second end of said at least one additional capacitor coupled to a supply voltage.

4. The power supply rejection circuit of claim 1 wherein said at least one additional capacitor comprises a capacitor from said supply voltage to a stored reference point associated with said power supply rejection circuit during said comparison of said signal to said stored reference voltage utilizing said comparison circuit.

5. The power supply rejection circuit of claim 4 wherein said at least one existing capacitor comprises a second capacitor from said stored reference voltage to a ground.

6. The power supply rejection circuit of claim 1 wherein said power supply rejection circuit is adapted for use with a sensor.

7. The power supply rejection circuit of claim 1 wherein said stored reference voltage comprises a capacitively-stored reference voltage.

8. The power supply rejection circuit of claim 1 wherein said at least one existing capacitor of said comparison circuit comprises a capacitor for storing said stored reference voltage.

9. A power supply rejection circuit for capacitively-stored reference voltages, said power supply rejection circuit comprising:
a comparison circuit for comparing a signal associated with a power supply to a stored reference voltage, wherein said comparison circuit includes at least two capacitors therein;
wherein a first capacitor of the at least two capacitors is coupled to said comparison circuit, wherein said first capacitor comprises a first end and a second end;
said first end of said first capacitor is connected to a second capacitor of the at least two capacitors, such said first capacitor and said second capacitor operating in parallel with one another, thus negating a first order effect of power supply noise in the power supply rejection circuit;
said second end of said first capacitor is connected to a supply voltage;
wherein said first capacitors eliminates the effect of power supply noise associated with said comparison circuit during a comparison of said signal to said stored reference voltage utilizing said comparison circuit.

10. A power supply rejection circuit for capacitively-stored reference voltages, said power supply rejection circuit comprising:
a comparison circuit for comparing a signal associated with a power supply to a stored reference voltage, wherein said comparison circuit includes at least one existing capacitor therein; and
at least one additional capacitor coupled to said comparison circuit, wherein said at least one additional capacitor comprises a first end and a second end;
said first end of said at least one additional capacitor connected to said at least one existing capacitor of said comparison circuit, such said at least one additional capacitor and said at least one existing capacitor operating in parallel with one another, thus negating a first order effect of power supply noise in the power supply rejection circuit;
said second end of said at least one additional capacitor connected to a supply voltage;
wherein said at least one additional capacitor comprises a capacitor from said supply voltage to a stored reference point associated with said power supply rejection circuit and said at least one existing capacitor comprises a second capacitor from said stored reference voltage to a ground; and
wherein said at least one additional capacitor eliminates the effect of power supply noise associated with said comparison circuit during a comparison of said signal to said stored reference voltage utilizing said comparison circuit.

11. A method for forming a power supply rejection circuit for capacitively-stored reference voltages, said method comprising the steps of:
comparing a signal associated with a power supply to a stored reference voltage utilizing a comparison circuit that includes at least one existing capacitor therein;
coupling at least one additional capacitor to said comparison and
automatically forcing differences in supply voltage to appear on said stored reference voltage through the utilization of said at least one additional capacitor connected to said comparison circuit, thereby ensuring that said stored reference voltage is adjusted an equal amount by which a present single-ended output signal from said comparison circuit is offset; such that said at least one additional capacitor eliminates the effect of power supply noise associated with said comparison circuit during a comparison of said signal to said stored reference voltage utilizing said comparison circuit.

12. The method of claim 11 wherein said at least one additional capacitor comprises a first end and a second end.

13. The method of claim 12 further comprising the steps of:
connecting said first end of said at least one additional capacitor to said at least one existing capacitor of said comparison circuit; and
coupling said second end of said at least one additional capacitor to a supply voltage.

14. The method of claim 11 wherein said at least one additional capacitor comprises a capacitor from said supply voltage to a stored reference point associated with said power supply rejection circuit.

15. The method of claim 14 wherein said at least one existing capacitor comprises a second capacitor from said stored reference voltage to a ground.

16. The method of claim 11 wherein said power supply rejection circuit is adapted for use with a sensor.

17. The method of claim 11 wherein said stored reference voltage comprises a capacitively-stored reference voltage.

18. The method of claim 11 wherein said at least one existing capacitor of said comparison circuit comprises a capacitor for storing said stored reference voltage.

19. A method for forming a power supply rejection circuit for capacitively-stored reference voltages, said method comprising the steps of:
comparing a signal associated with a power supply to a stored reference voltage, utilizing a comparison circuit that includes at least one existing capacitor therein;
coupling at least one additional capacitor to said comparison circuit, wherein said at least one additional capacitor comprises a first end and a second end;
connecting said first end of said at least one additional capacitor to said at least one existing capacitor of said comparison circuit, such said at least one additional capacitor and said at least one existing capacitor operating in parallel with one another;

connecting said second end of said at least one additional capacitor to a supply voltage;

wherein said at least one additional capacitor comprises a capacitor from said supply voltage to a stored reference point associated with said power supply rejection circuit and said at least one existing capacitor comprises a second capacitor from said stored reference voltage to a ground; and wherein said at least one additional capacitor eliminates the effect of power supply noise associated with said comparison circuit during a comparison of said signal to said stored reference voltage utilizing said comparison circuit.

* * * * *